United States Patent
Shi et al.

(10) Patent No.: US 11,404,973 B2
(45) Date of Patent: Aug. 2, 2022

(54) GENERALIZED EQUIVALENT CIRCUIT MODEL OF MMC-HVDC FOR POWER SYSTEM SIMULATION

(71) Applicants: Di Shi, San Jose, CA (US); Xiaoying Zhao, San Jose, CA (US); Feng Xue, Nanjing (CN); Wei Li, Nanjing (CN); Huimin Peng, Nanjing (CN); Jiangchao Qin, Tempe, AZ (US); Chaoyang Jing, Pasadena, CA (US); Zhiwei Wang, San Jose, CA (US)

(72) Inventors: Di Shi, San Jose, CA (US); Xiaoying Zhao, San Jose, CA (US); Feng Xue, Nanjing (CN); Wei Li, Nanjing (CN); Huimin Peng, Nanjing (CN); Jiangchao Qin, Tempe, AZ (US); Chaoyang Jing, Pasadena, CA (US); Zhiwei Wang, San Jose, CA (US)

(*) Notice: Subject to any disclaimer, the term of this patent is extended or adjusted under 35 U.S.C. 154(b) by 522 days.

(21) Appl. No.: 16/562,566

(22) Filed: Sep. 6, 2019

(65) Prior Publication Data
US 2020/0201953 A1   Jun. 25, 2020

Related U.S. Application Data

(60) Provisional application No. 62/782,233, filed on Dec. 19, 2018.

(51) Int. Cl.
*H02M 7/483* (2007.01)
*H02J 3/36* (2006.01)
*G06F 30/367* (2020.01)

(52) U.S. Cl.
CPC ........ *H02M 7/4835* (2021.05); *G06F 30/367* (2020.01); *H02J 3/36* (2013.01); *H02M 7/483* (2013.01)

(58) Field of Classification Search
CPC .... H02M 7/4835; H02M 1/32; H02M 1/0095; G06F 30/367; H02J 3/36
See application file for complete search history.

(56) References Cited

U.S. PATENT DOCUMENTS

2010/0080024 A1* 4/2010 Wei .................... H03K 17/0828
                                                                  363/74
2012/0218027 A1* 8/2012 Ioannidis .............. H02M 7/003
                                                                  327/513

(Continued)

OTHER PUBLICATIONS

Jiangchao Qin, Hybrid Design of Modular Multilevel Converters for HVDC Systems Based on Various Submodule Circuits, Sep. 16, 2014, IEEE Transactions on Power Delivery (vol. 30, Issue: 1, Feb. 2015), pp. 385-394 (Year: 2014).*

(Continued)

*Primary Examiner* — Alex Torres-Rivera
(74) *Attorney, Agent, or Firm* — Patent PC; Bao Tran

(57) ABSTRACT

A method to simulate a circuit includes receiving at least one circuit requirement and at least one Modular Multilevel Converter (MMC) parameter; determining an operating mode and switching states of an arm circuit; determining each capacitor current based on the switching states and an arm current; determining capacitor voltage and arm voltage; and generating an equivalent circuit model to simulate MMC-based HVDC systems and DC grids in a hybrid AC and DC power system.

19 Claims, 12 Drawing Sheets

(56) References Cited

U.S. PATENT DOCUMENTS

| | | | | |
|---|---|---|---|---|
| 2013/0128636 A1* | 5/2013 | Trainer | ............... | H02J 7/02 363/65 |
| 2015/0162848 A1* | 6/2015 | Harnefors | ............ | H02M 7/539 363/78 |
| 2016/0268915 A1* | 9/2016 | Lin | ............... | H02M 1/32 |
| 2017/0132337 A1* | 5/2017 | Li | ............... | G06F 30/367 |
| 2019/0312504 A1* | 10/2019 | Kim | ............... | H02M 1/32 |
| 2019/0356217 A1* | 11/2019 | Kim | ............... | H02M 7/4835 |

OTHER PUBLICATIONS

S. Debnath, J. Qin, B. Bahrani, M. Saeedifard, and P. Barbosa, "Operation, control, and applications of the modular multilevel converter: A review," IEEE Trans. Power Electron., vol. 30, No. 1, pp. 37-53, 2015.

P. Wang, X.-P. Zhang, P. F. Coventry, and R. Zhang, "Start-up control of an offshore integrated mmc multi-terminal hvdc system with reduced dc voltage," IEEE Trans. Power Sys., vol. 31, No. 4, pp. 2740-2751, 2016.

Y. Wang, Z. Yuan, and J. Fu, "A novel strategy on smooth connection of an offline mmc station into mtdc systems," IEEE Trans. Power Del., vol. 31, No. 2, pp. 568-574, 2016.

R. Li, L. Xu, L. Yao, and B. W. Williams, "Active control of default currents in dc solid-state transformers during ride-through operation of multi-terminal hvdc systems," IEEE Trans. Energy Convers., vol. 31, No. 4, pp. 1336-1346, 2016.

G. P. Adam and B. W. Williams, "Half-and full-bridge modular multilevel converter models for simulations of full-scale hvdc links and multiterminal dc grids," IEEE Journal of Emerging and Selected Topics in Power Electronics, vol. 2, No. 1, pp. 1089-1108, 2014.

J. Peralta, H. Saad, S. Dennetiere, J. Mahseredjian, and S. Nguefeu, "Detailed and averaged models for a 401-level mmc-hvdc system," IEEE Trans. Power Del., vol. 27, No. 3, pp. 1501-1508, 2012.

H. Saad, J. Peralta, S. Dennetiere, J. Mahseredjian, J. Jatskevich, J. Martinez, A. Davoudi, M. Saeedifard, V. Sood, X. Wang et al., "Dynamic averaged and simplified models for MMC-based HVDC transmission systems," IEEE Trans. Power Del., vol. 28, No. 3, pp. 1723-1730, 2013.

H. Yang, Y. Dong, W. Li, and X. He, "Average-value model of modular multilevel converters considering capacitor voltage ripple," IEEE Trans. Power Del., vol. 32, No. 2, pp. 723-732, Apr. 2017.

N. Ahmed, L. Ängquist, S. Mahmood, A. Antonopoulos, L. Harnefors, S. Norrga, and H.-P. Nee, "Efficient Modeling of an MMC-Based Multiterminal DC System Employing Hybrid HVDC Breakers," IEEE Trans. Power Del., vol. 30, No. 4, pp. 1792-1801, 2015.

W. Xiang, W. Lin, T. An, J. Wen, and Y. Wu, "Equivalent Electromagnetic Transient Simulation Model and Fast Recovery Control of Overhead VSC-HVDC Based on SB-MMC," IEEE Trans. Power Del., vol. 32, No. 2, pp. 778-788, Apr. 2017.

J. Qin, M. Saeedifard, A. Rockhill, and R. Zhou, "Hybrid design of modular multilevel converters for HVDC systems based on various submodule circuits," IEEE Trans. Power Del., vol. 30, No. 1, pp. 385-394, 2015.

B. Li, D. Xu, Y. Zhang, R. Yang, G. Wang, W. Wang, and D. Xu, "Closed-loop precharge control of modular multilevel converters during start-up processes," IEEE Trans. Power Electron , vol. 30, No. 2, pp. 524-531, Feb. 2015.

J. Qin, S. Debnath, and M. Saeedifard, "Precharging strategy for softstartup process of modular multilevel converters based on various sm circuits," in IEEE Applied Power Electronics Conference and Exposition (APEC 2016), Mar. 2016, pp. 1528-1533.

L. Zhang, J. Qin, X. Wu, S. Debnath, and M. Saeedifard, "A Generalized Precharging Strategy for Soft Startup Process of the Modular Multilevel Converter-Based HVDC Systems," IEEE Trans. Ind. Appl., vol. PP, No. 99, pp. 1-1, 2017.

F. Ertürk and A. M. Hava, "A detailed power loss analysis of modular multilevel converter," in 2015 IEEE Applied Power Electronics Conference and Exposition (APEC), Mar. 2015, pp. 1658-1665.

* cited by examiner

GENERALIZED EQUIVALENT CIRCUIT MODEL OF MMC-HVDC FOR POWER SYSTEM SIMULATION

TECHNICAL FIELD

This invention relates to an efficient model of Modular Multilevel Converters (MMCs), which is based on the generalized equivalent circuit for high-voltage direct current (HVDC) systems.

BACKGROUND

MMCs have become the basic building block for multi-terminal dc (MTDC) systems and dc grids. Due to modularity and scalability, the MMC becomes the most attractive converter topology for medium/high voltage applications, especially for voltage-sourced converter high-voltage direct current (VSC-HVDC) transmission systems. Large-scale MMCs-embedded power systems need to investigate dynamic performance, fault, protection, and stability. The efficient model of MMC is one of the main challenges associated with the study of large-scale MMC-based power systems.

To analyze large-scale hybrid ac and dc power systems, modeling and simulation plays an important role in investigating system dynamics under various operating conditions, i.e., startup, normal, transient, and fault conditions. However, it is time consuming and infeasible to model and simulate large-scale MMCs-embedded power systems with detailed switching model (DSM).

However, detailed DSM modeling is time-consuming and infeasible due to a large number of semiconductor switches in high-level systems. To address this challenge, several MMC models have been developed to accelerate the electromagnetic transient (EMT) simulation, which are classified as the average-value model and the equivalent circuit model. The existing models of MMC can be further improved and be more generalized. The existing models only considered the half-bridge (HB) submodule (SM), full-bridge (FB) SM, as well as the unipolar full-bridge (UFB) SM. To implement a generalized and efficient MMC model, other fault-blocking SM configurations should be considered, such as the clamp-double (CD), and the three-level/five-level cross-connected (3LCC/5LCC) SMs. Then, various operating conditions are investigated for the MMCs based on various SM configurations.

SUMMARY OF THE INVENTION

In one aspect, a method to simulate a circuit includes receiving at least one circuit requirement and at least one Modular Multilevel Converter (MMC) parameter; determining an operating mode and switching states of an arm circuit; determining each capacitor current based on the switching states and an arm current; determining capacitor voltage and arm voltage; and generating an equivalent circuit model to simulate MMC-based HVDC systems and DC grids in a hybrid AC and DC power system.

In another aspect, a generalized equivalent circuit model (ECM) is used for modeling and simulating the MMCs based on various SM circuits and arm configurations under different operating conditions. A generalized arm equivalent circuit is used to model and simulate various MMCs under startup/precharging, normal, and fault conditions. The ECM considers all internal states and can be used to investigate internal dynamic control strategies, e.g., capacitor voltage balancing strategies. To further improve simulation efficiency, the reduced-order ECM is derived by neglecting the dynamics of individual capacitor voltage and considering the average capacitor voltage. The modeling technique can efficiently and accurately model and simulate the MMC-HVDC systems based on various SM circuits and arm configuration under different operating conditions.

The equivalent circuit model (ECM) can significantly improve simulation efficiency and be applied for precharging, normal, and fault operation analysis of the MMC-HVDC systems while considering the behaviors of various SMs. This invention can also be used to investigate internal dynamics based on various control strategies, e.g., capacitor voltage balancing, when full states are considered.

BRIEF DESCRIPTIONS OF FIGURES

DETAILED DESCRIPTION OF THE ILLUSTRATED EMBODIMENTS

I. Configurations and Operational Principles of the ECM

A. Operational Principles of the MMCs Based on Various SM Configurations

A system is disclosed with an equivalent circuit model to model and to simulate MMC-based HVDC systems and dc grids in a large-scale hybrid ac and dc power system, and the system can consider various SM circuits and arm configurations under different operating conditions.

Figure 1:
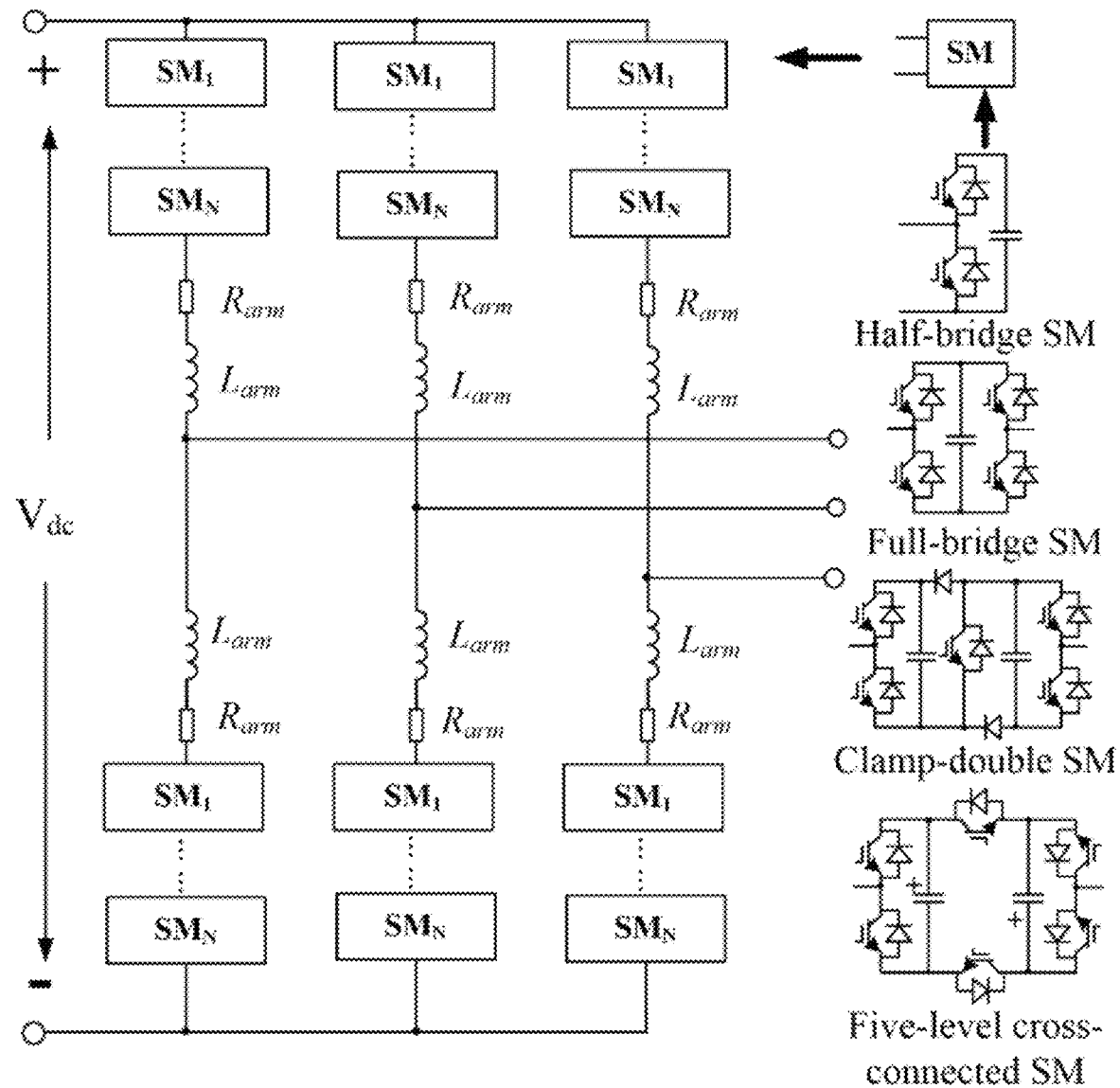
FIG. 1 shows an exemplary block diagram of the MMC and various SM circuits.

A schematic diagram of the MMC and various SM circuits are shown in FIG. 1. The operating states of the HB SM include inserted, bypassed, and blocked. The various fault-blocking SMs consist of parallel-connected or series-connected HB SMs.

The operating conditions of MMCs mainly include the precharging/startup process, the normal operating condition, and the fault condition. Under dc fault condition, the MMC based on HB-SM (HB-MMC) cannot block the fault current feeding from ac grid. Under dc fault condition, the capacitors in fault-blocking SMs can support the line-line voltage and block the fault current. In addition, under dc fault condition, the MMCs based on bipolar SMs (CD SM, FB SM, and 5LCC SM) are still able to work as the static synchronous compensator (STATCOM).

B. Overview of the ECM

Figure 2:
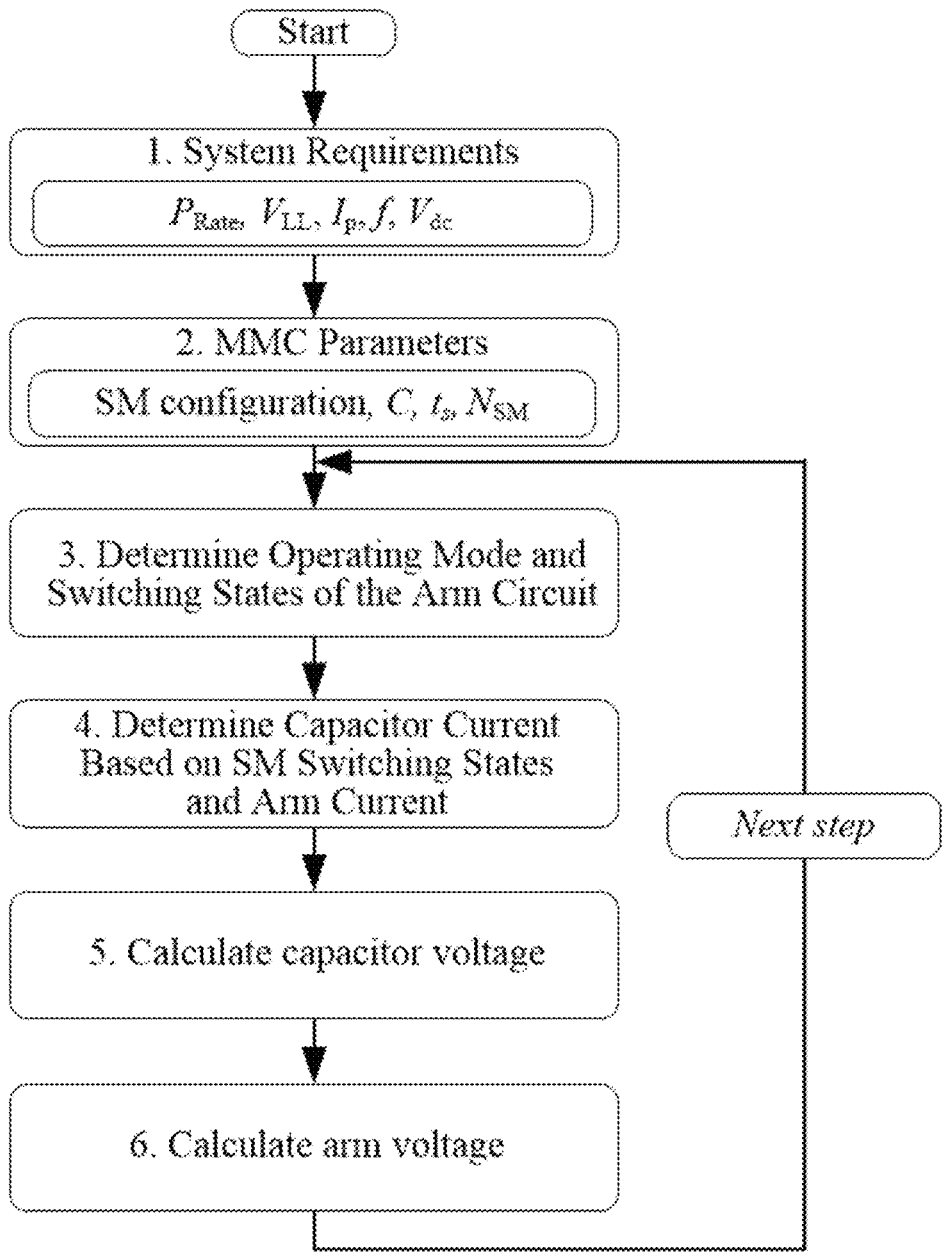
FIG. 2 shows an exemplary flowchart implementing the equivalent circuit model for MMC.

FIG. 2 indicates a generalized flowchart of implementing the ECM for MMC. Firstly, the fixed parameters are determined including rated power, rated voltage, simulation step time, number of SMs per arm ($N_{SM}$), and SM configuration. Based the above information and the operating conditions of MMC, the switching states of arm circuit are determined. Before calculating each capacitor voltage, the capacitor current is determined from the arm current and the SM switching sates. Based on the calculated capacitor current, the capacitor voltage is solved by differential equation through numerical methods. Finally, the arm voltage is calculated from voltages of the inserted capacitors.

Figure 3A:
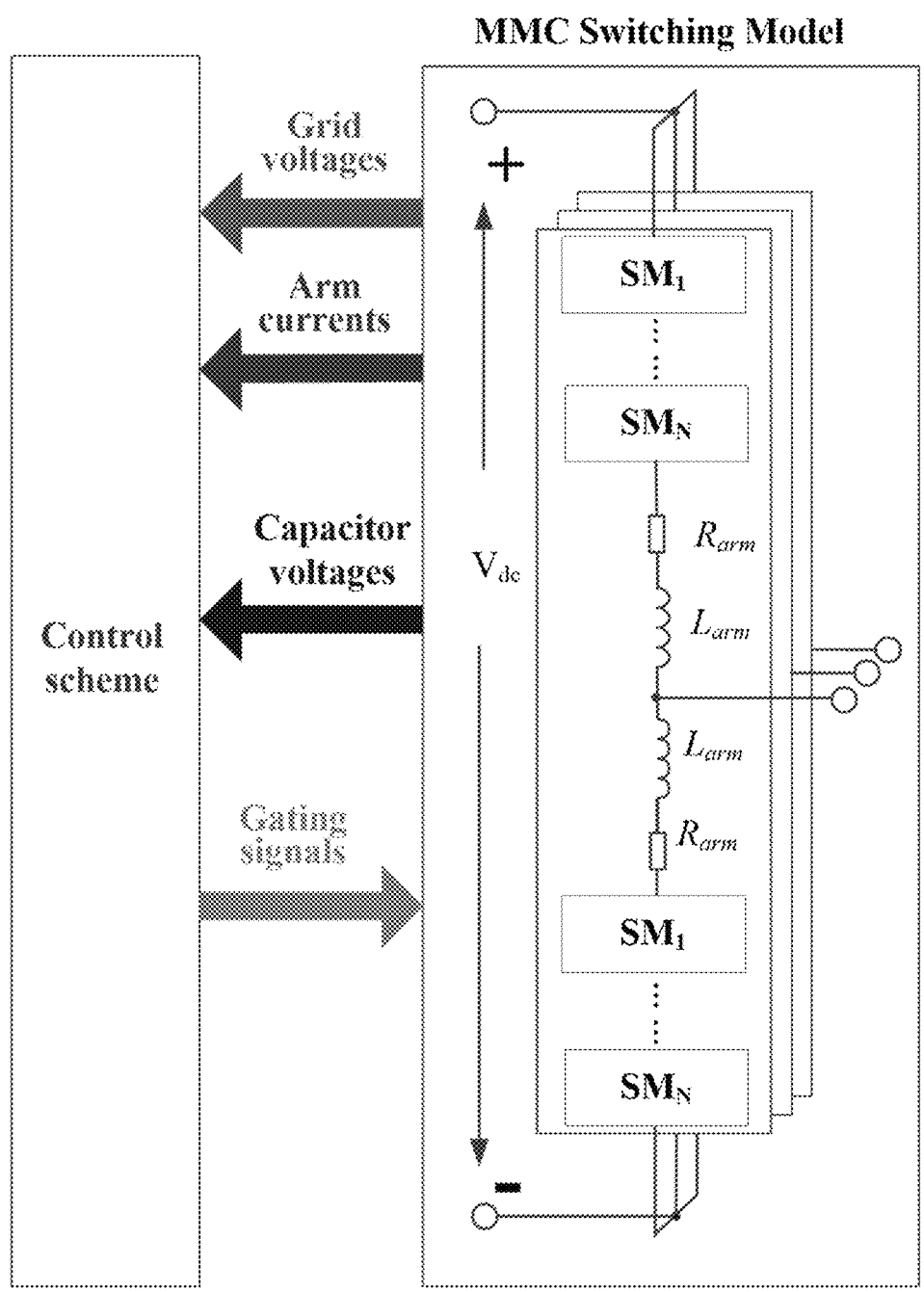
FIG. 3A-3B show an exemplary schematic of MMC based on (A) DSM, and (B) ECM.
Figure 3B:
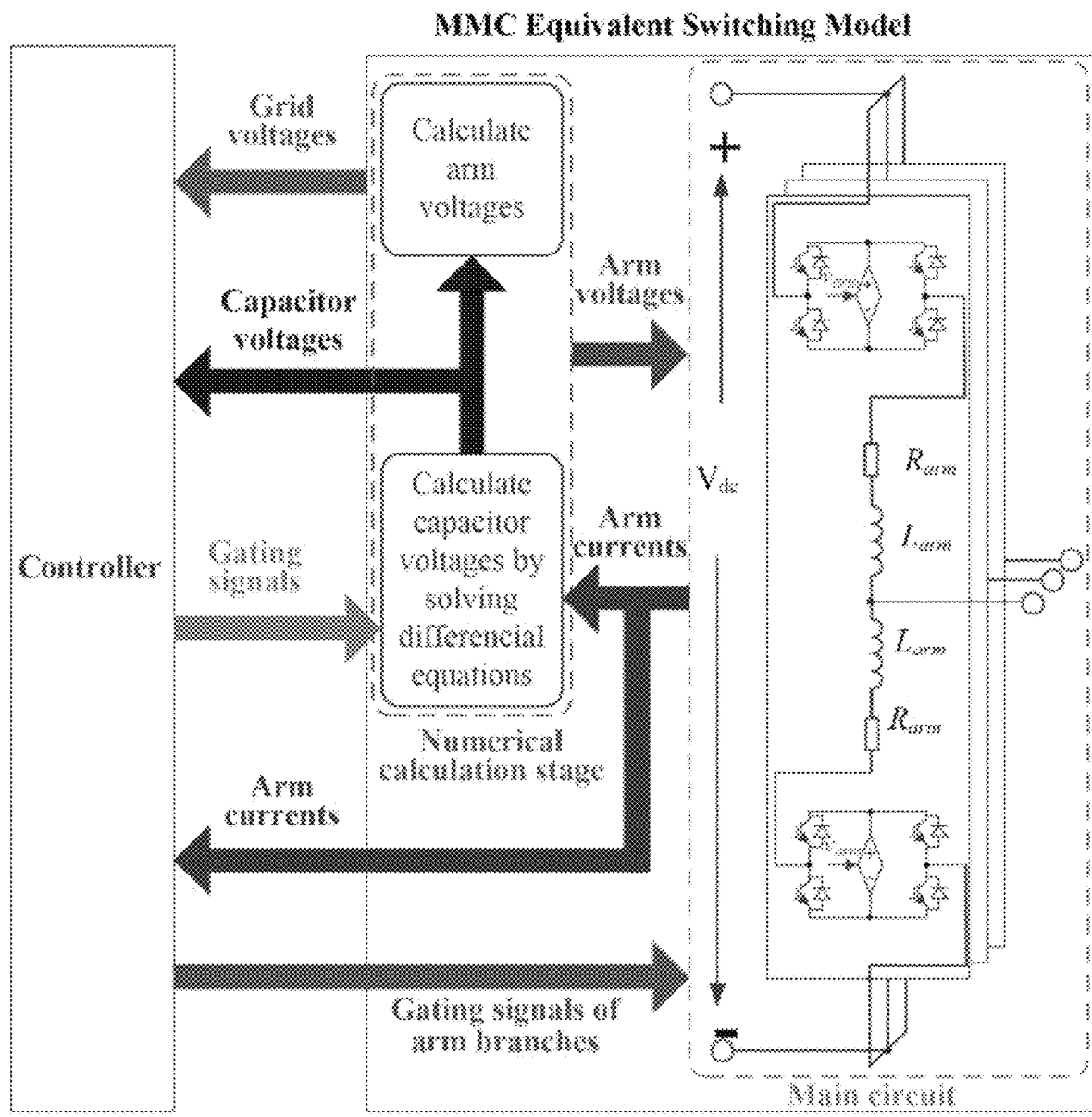

FIG. 3A-3B show the schematics of MMCs based on the DSM and ECM. According to FIG. 3A, the control scheme requires grid voltages, MMC arm currents, and capacitor voltages from main circuit. Based on these information, the control strategy generates gating signals to MMC. When replacing DSM based MMC with the ECM based MMC, more information is exchanged, as shown in FIG. 3B. In the ECM based MMC, the SM capacitor voltages are numerically calculated and transmitted to the control strategy. In addition to the gating signals of SMs, the control strategy should also generate gating signals of arm circuits.

C. Configuration and Operational Principles of the Detailed ECM

Figure 4:
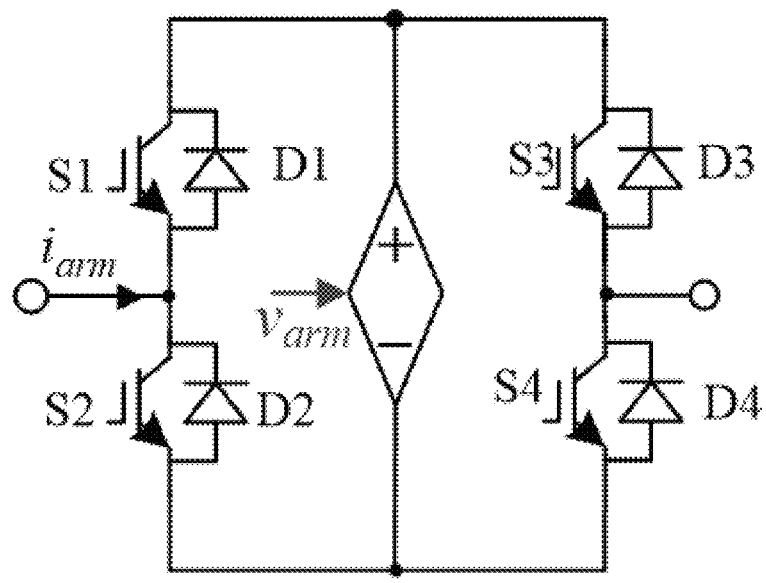
FIG. 4 shows an exemplary flowchart of implementing the equivalent circuit model for MMC.

1) Configuration of Arm Branch:

To develop the equivalent circuit of the arm branch, various SMs are classified as unipolar SMs and bipolar SMs at first. The unipolar SMs include HB SM, UFB SM, and 3LCC SM; the bipolar SMs include the FB SM, CD SM, and 5LCC SM. Under the normal operating condition, the unipolar SMs have the same behavior as HB SM, while the bipolar SMs have similar behavior with FB SM. In addition, the FB SM can work as HB SM. In this way, the FB SM configuration can simulate the behaviors of various SMs, which is selected as the configuration of arm branch, as shown in FIG. 4.

2) Operating Modes and Switching States of the Arm Circuit:

The operating modes and switching states of the arm branch are determined by the SM configurations and the operating modes of MMC, which are listed in Table I.

TABLE I

Operating Mode and Switching States of the Proposed ECM

| Operating condition | | SM | $v_{arm}$ | S1 | S2 | S3 | S4 |
|---|---|---|---|---|---|---|---|
| Precharging | Uncontrollable | HB | Any | 0 | 0 | 0 | 1 |
| | | Other | Any | 0 | 0 | 0 | 0 |
| | Controllable | All | Any | 0 | 0 | 0 | 1 |
| Normal | | Unipolar | + | 1 | 0 | 0 | 1 |
| | | Bipolar | + | 1 | 0 | 0 | 1 |
| | | | − | 0 | 1 | 0 | 0 |
| DC fault | | HB | Any | 0 | 0 | 1 | 1 |
| | | Other | Any | 0 | 0 | 0 | 0 |

Precharging condition: The precharging/startup process includes the uncontrollable precharging stage and the controllable precharging stage. During precharging/startup process, to simulate the behavior of HB-MMC, only S4 should be turned ON. During uncontrollable precharging stage, the MMC consisted of the fault-blocking SMs are fully blocked. In this case, all switches in the arm circuit are turned OFF. During controllable precharging stage, the MMC consisted of the fault-blocking SMs has the same behavior as HB-MMC.

Normal operating condition: Under normal condition, the MMC based on the unipolar SMs operates as the HB-MMC. In this case, the S1 and S4 are turned ON. In the MMC based on the bipolar SMs, the arm voltage can be either positive or negative. In this way, the switching states are determined by the polarity of arm voltage. When it is positive, the S1 and S4 are turned ON. When it is negative, the S2 and S3 are turned ON.

DC fault condition: Under this condition, the HB-MMC cannot block fault current feeding from ac grid. To simulate its behavior, only the S4 of the arm circuit is turned ON. The MMC based on fault-blocking SMs can block the fault current by turning OFF all switches. To simulate its behavior, all switches of the arm circuit are turned OFF. In addition, the MMC based on bipolar SMs can still work as STATCOM. It has the same switching states as normal condition.

3) Capacitor Voltage:

To solve the arm voltage, the capacitor voltages should be determined at first. In each SM, the relationship between the capacitor current and voltage is defined by the differential equation.

$$i_c = C \frac{dv_c}{dt} \quad (1)$$

where $v_c$ represents the capacitor voltage and $i_c$ refers to the capacitor current. The capacitor voltage is related to the integration of the capacitor current, which can be solved by numerical methods.

The capacitor current is related to the arm current and the switching states of each SM.

Controllable conditions: Under normal operating condition and the controllable precharging stage, various SMs are regarded as series-connected or parallel-connected HB SMs. In this case, the capacitor current is given by:

$$i_c = S_{SM} i_{arm} \quad (2)$$

where SSM is the switching function of the HB SM and defined by $$S_{SM} = \begin{cases} 1, \text{ inserted,} \\ 0, \text{ bypassed} \end{cases} \quad (3)$$

Uncontrollable conditions: Under dc fault condition or uncontrollable precharging stage, when all switches are turned OFF, all SMs are blocked. Under this condition, only the positive arm current flows through the capacitor in HB SM. The FB, UFB, 3LCC, and 5LCC SMs have the same behavior. Either the positive arm current or the negative arm current flow through the capacitor. In this way, the capacitor current is determined by $i_c = |i_{arm}|$. For the CD SM, when the arm current is positive, the two HB SMs are connected in series. In this way, the capacitor current is $|i_{arm}|$. When the arm current is negative, the two HB SMs are paralleled. The two capacitors share the arm current. Thus, the capacitor current is $0.5|i_{arm}|$.

4) Arm Voltage:

After solving the capacitor voltages, the arm voltage is determined by the voltages of the inserted capacitors. Under controllable conditions, the arm voltage is the sum of capacitor voltages in ON-state SMs. Under uncontrollable conditions, the arm voltage is determined by summing the voltages of the inserted capacitors.

D. Reduced-Order ECM

To further improve the efficiency of modeling and simulating large-scale MMC-embedded power systems, the ECM can be modified by reducing the number of state variables, i.e., capacitor voltages. This reduced-order ECM assumes that all capacitor voltages are well balanced and only the average capacitor voltage of each arm is considered to calculate the arm voltage.

Under the normal operating condition, various SMs have similar operating behaviors. As analyzed in [8], the average capacitor current is derived as $$i_{c,ave} = \frac{1 + d_{arm}}{2} i_{arm} \quad (4)$$

where $d_{arm}$ is the duty cycle of each SM per arm, which is defined as $d_{arm} = m \cdot \sin(\omega t + \varphi_{arm})$.

E. Simulation Verification

Figure 5:
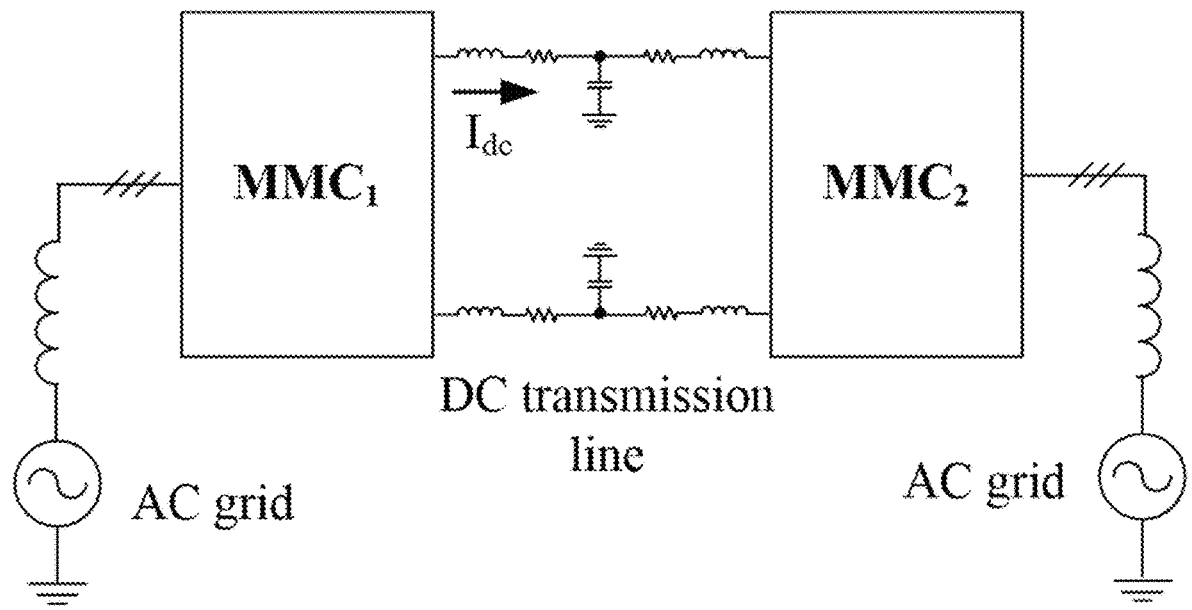
FIG. 5 shows an exemplary schematic diagram of a point-to-point MMC-HVDC system.

To verify the ECM, a point-to-point MMC-HVDC system is selected as the study system and built in PSCAD/EMTDC program environment, as shown in FIG. 5. The system parameters are listed in Table II.

TABLE II

System Parameters Of the MMC-HVDC System

| Parameters | Nominal Value |
|---|---|
| Rated power | 25 MW |
| DC link voltage | 60 kV |
| AC grid line-to-line voltage | 30 kV RMS |
| Numver of SMs per arm, $N_{SM}$ | 20 |
| Arm inductance | 5 mH |
| Capacitance per SM | 1000 μF |
| Rated capacitor voltage per SM | 3 kV |
| DC line inductance | 1 mH |
| DC line resistance | 1 Ω |
| DC line capacitance | 100 μF |

Figure 6A:
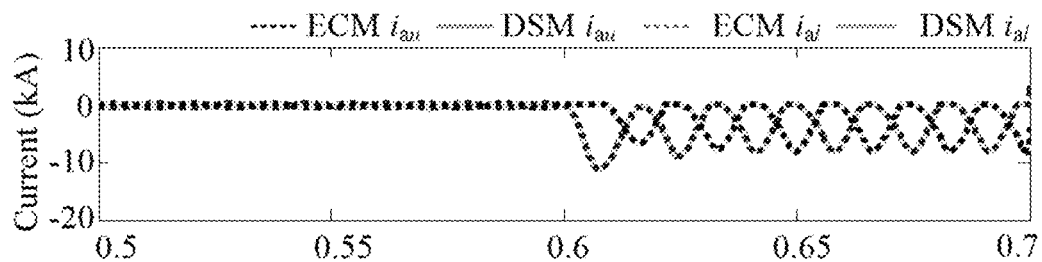
FIG. 6A-6B show exemplary simulation results of the HB-MMC-HVDC based on the DSM and the detailed ECM: (A) phase current, and (B) dc current.
Figure 6B:
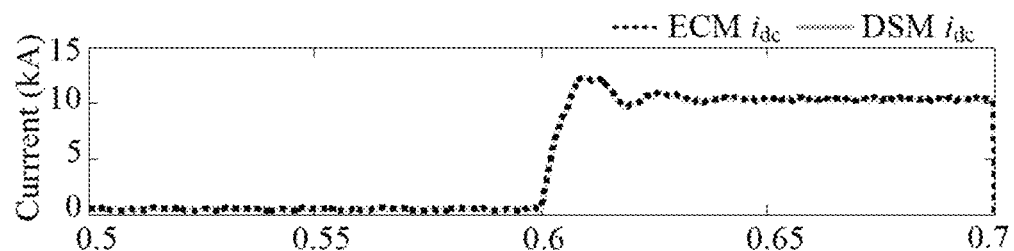
Figure 7A:
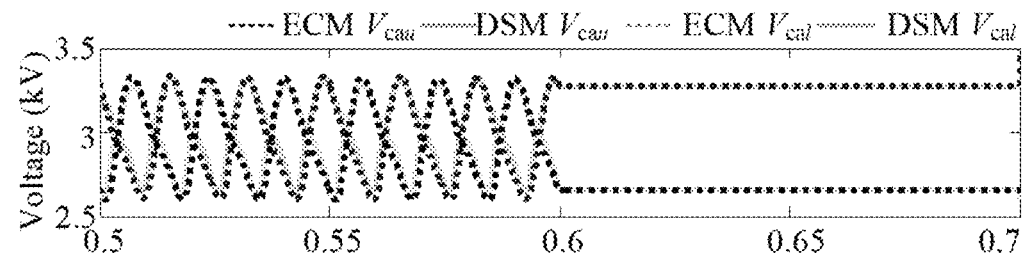
FIG. 7A-7B show exemplary capacitor voltages of the HB-MMC-HVDC based on the DSM and the detailed ECM: (A) MMC1, and (B) MMC2.
Figure 7B:
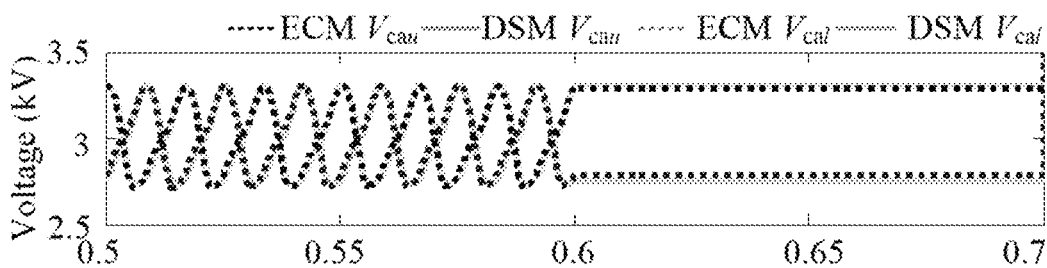
Figure 8A:
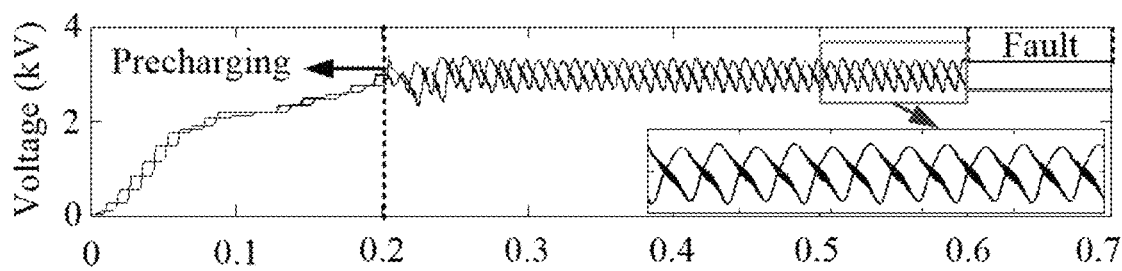
FIG. 8A-8B show exemplary capacitor voltages of MMC1 of the HB-MMC-HVDC based on: (A) the DSM, and (B) the detailed ECM.
Figure 8B:
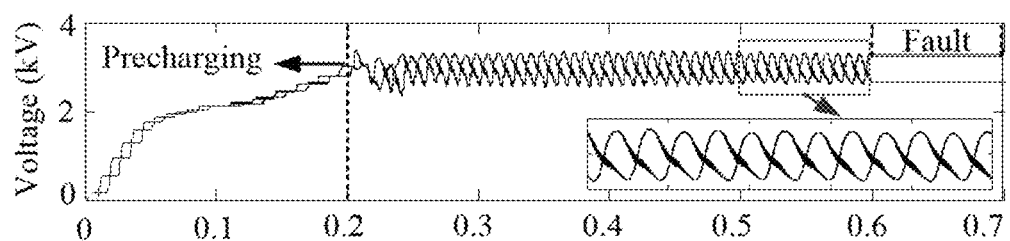

1) The Detailed ECM:

The HB-MMC-HVDC system is modeled and simulated based on the DSM and the detailed ECM, respectively. Their phase-a arm currents, dc currents, and capacitor voltages are compared, as shown in FIGS. 6, 7, and 8. During 0.6 to 0.7 s, when dc fault occurs, the HB-MMC cannot block the fault current fed from ac grid. As shown in FIGS. 6 and 7, the waveforms of arm currents and capacitor voltages generated by the DSM and the detailed ECM coincide, which demonstrate the accuracy of the ECM. FIG. 8 shows the simulation results based on the DSM and the detailed ECM under different operating conditions, which demonstrates that the ECM can effectively model and simulate the MMC-based systems for various operating conditions.

Figure 9A:
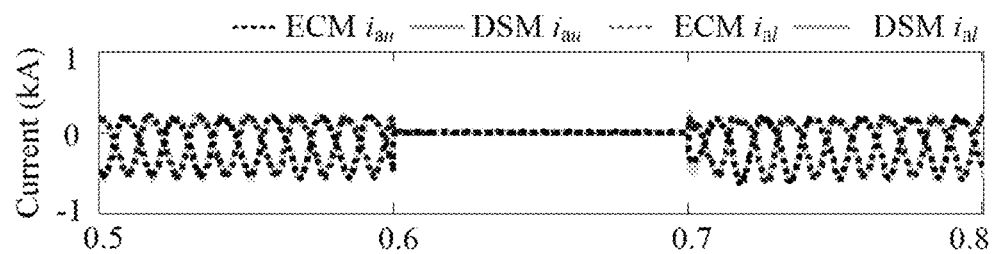
FIG. 9A-9B show exemplary simulation results of the FB-MMC-HVDC based on the DSM and the detailed ECM: (A) phase current, and (B) dc current.
Figure 9B:
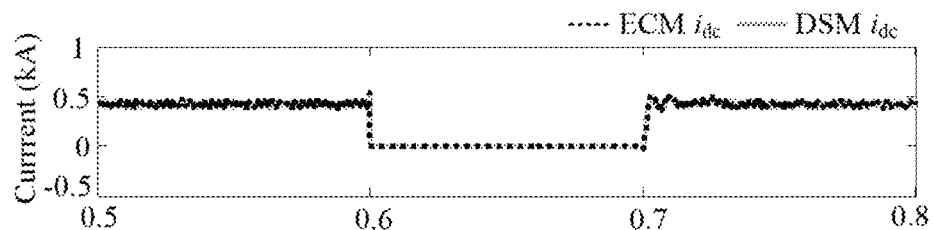
Figure 10A:
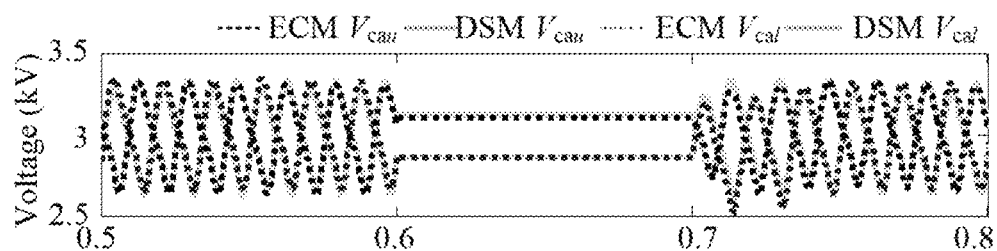
FIG. 10A-10B show exemplary capacitor voltages of the FB-MMC-HVDC based on the DSM and the detailed ECM: (A) MMC1, and (B) MMC2.
Figure 10B:
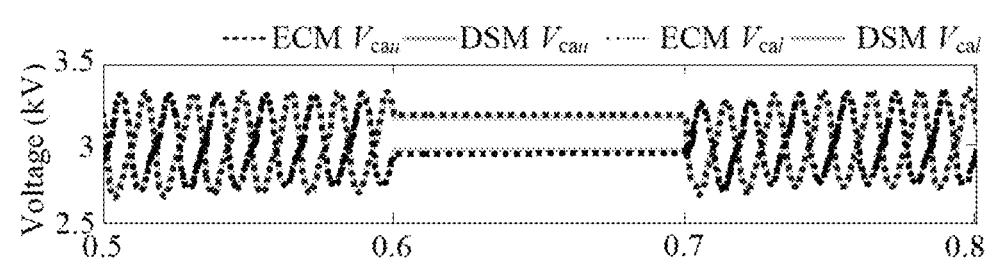
Figure 11A:
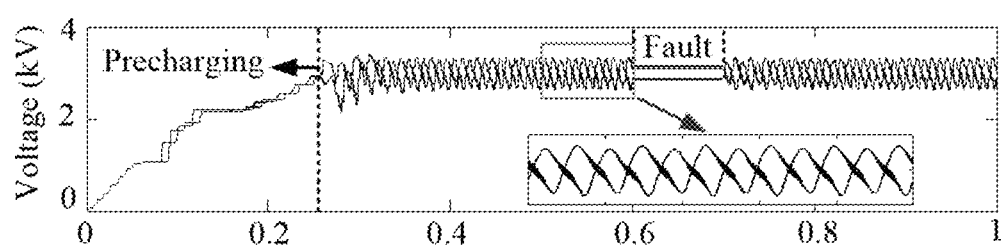
FIG. 11A-11B show exemplary capacitor voltages of MMC1 of the FB-MMC-HVDC based on: (A) the DSM, and (B) the detailed ECM.
Figure 11B:
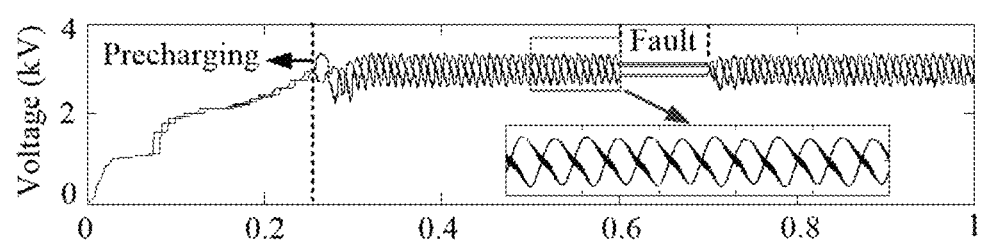

The MMCs based on the FB, UFB, 3LCC, and 5LCC SMs have similar behaviors. FIGS. 9, 10, and 11 show the arm currents, phase currents, and capacitor voltages of the FB-MMC-HVDC system modeled by the DSM and the detailed ECM under various operating conditions. The simulation results demonstrate the effectiveness of the ECM for various operating conditions.

Figure 12A:
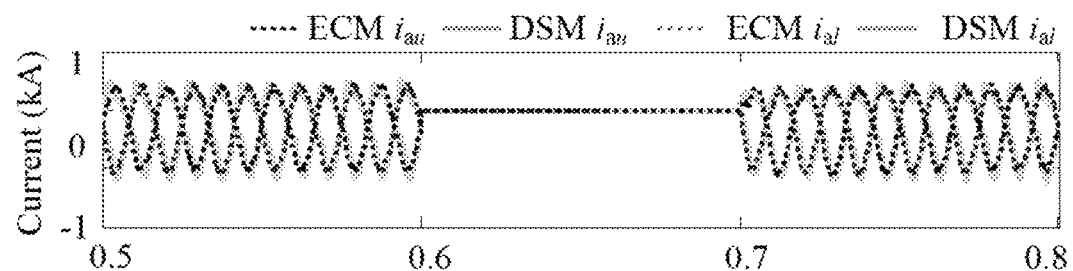
FIG. 12A-12B show exemplary simulation results of MMC1 of the CD-MMC-HVDC system based on the DSM and the detailed ECM: (A) arm currents, and (B) capacitor voltages.
Figure 12B:
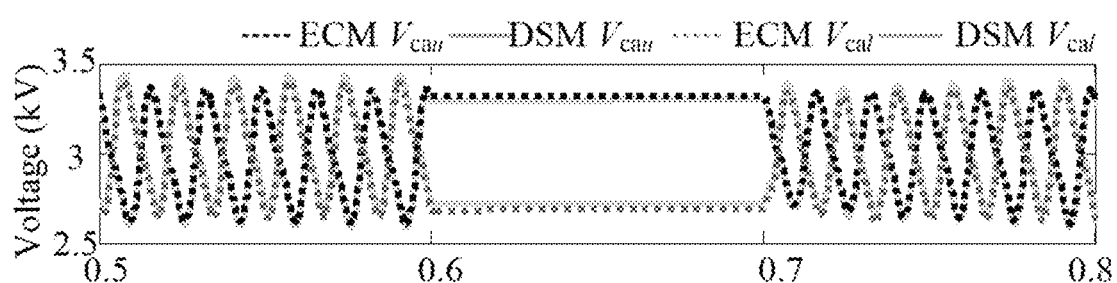
Figure 13:
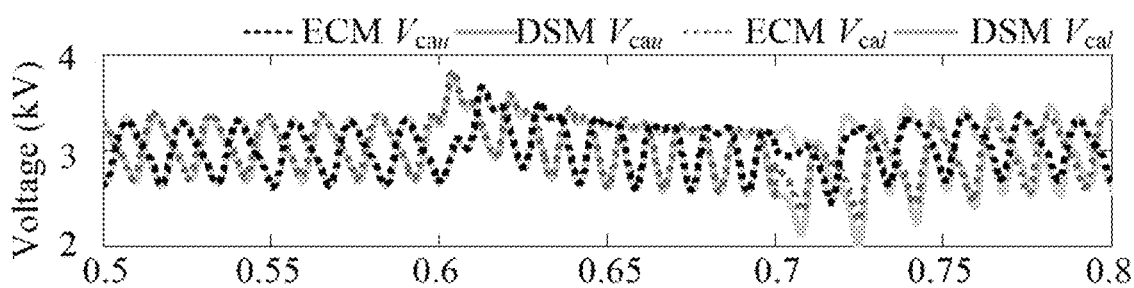
FIG. 13 shows exemplary capacitor voltages of FB-MMC operating as STATCOM.
Figure 14A:
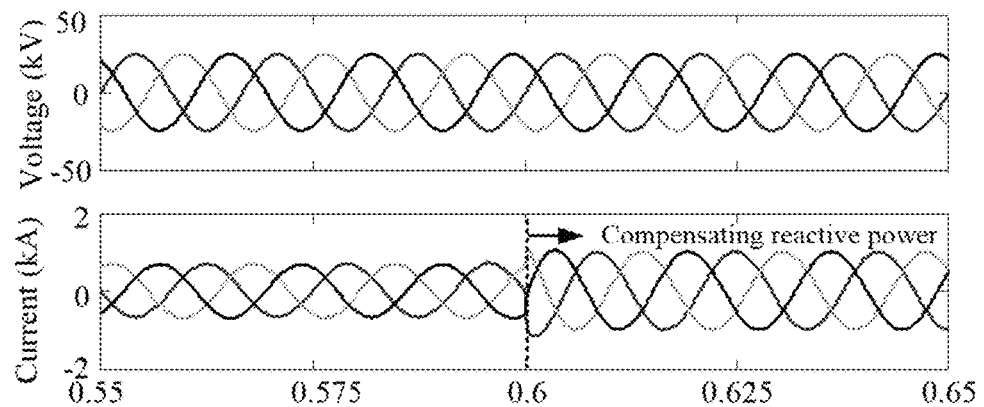
FIG. 14A-14B show exemplary simulation results of FB-MMC based on detailed GECM operates as STATCOM: (A) grid voltage and currents, and (B) capacitor voltages.
Figure 14B:
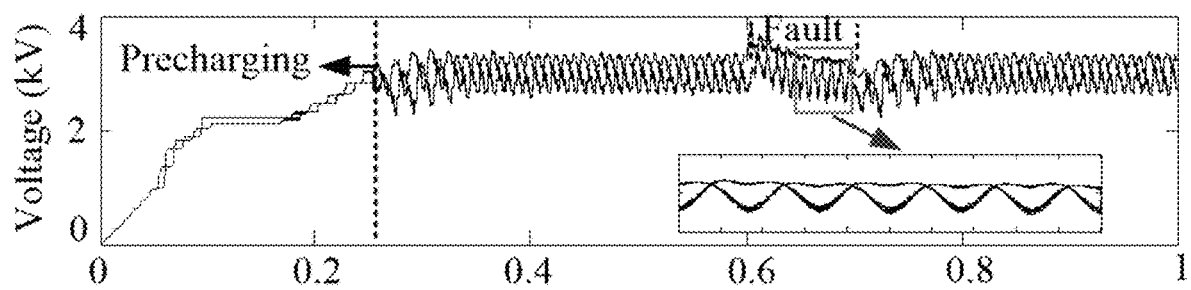

For the CD-MMC-HVDC system, the two capacitors in each SM are connected in parallel under fault operating condition. The waveforms of arm currents and capacitor voltages of the CD-MMC-HVDC based on the DSM and the detailed ECM are shown in FIG. 12, which coincide. Under the dc-fault condition, FB-MMC can still operate as STATCOM to compensate reactive power for ac grid. The corresponding simulation results of DSM and detailed GECM are shown in FIGS. 13 and 14.

2) The Reduced-Order ECM:

If capacitor voltage balancing strategies are not considered, the detailed ECM can be modified by assuming that all capacitor voltages are balanced well. This reduced-order ECM has better efficiency by considering the average capacitor voltage and neglecting the dynamics of each capacitor voltage.

Figure 15A:
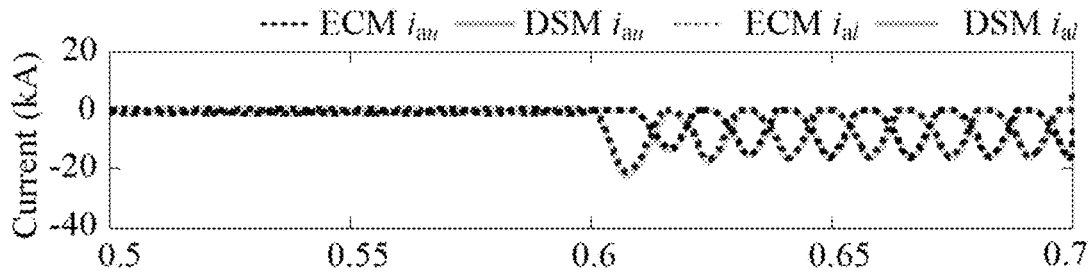
FIG. 15A-15B show an exemplary simulation results of MMC1 of the HB-MMC-HVDC based on the DSM and the reduced-order ECM: (A) phase current, and (B) dc current.
Figure 15B:
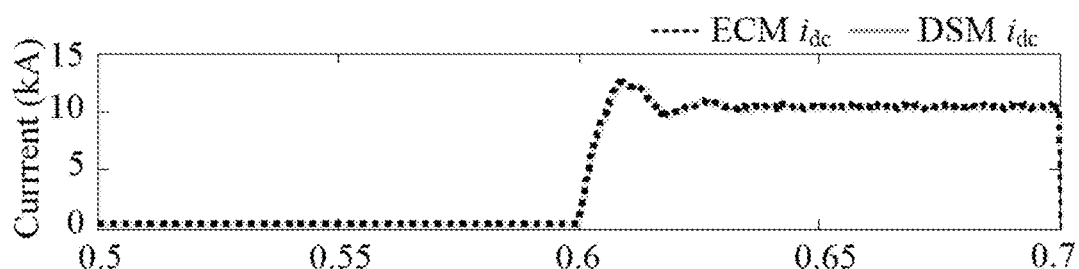
Figure 16A:
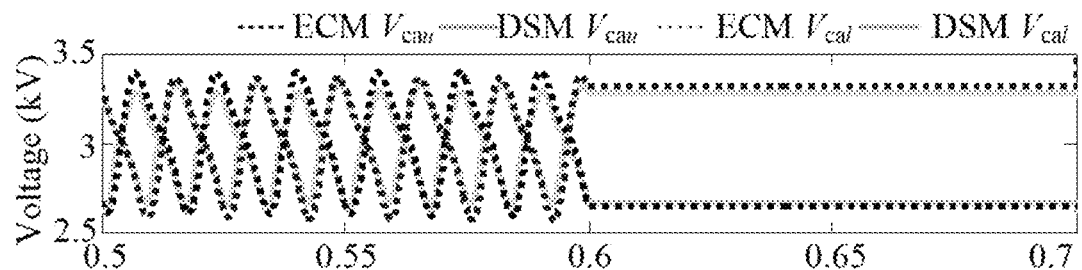
FIG. 16A-16B show exemplary capacitor voltages of (A) MMC1, and (B) MMC2 of HB-MMC-HVDC based on DSM and simplified ECM.
Figure 16B:
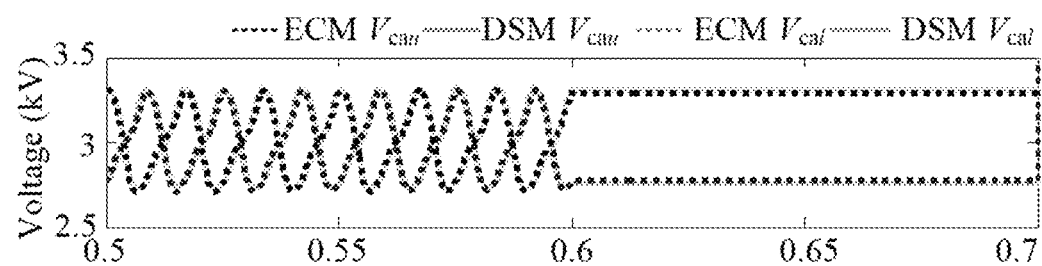
Figure 17:
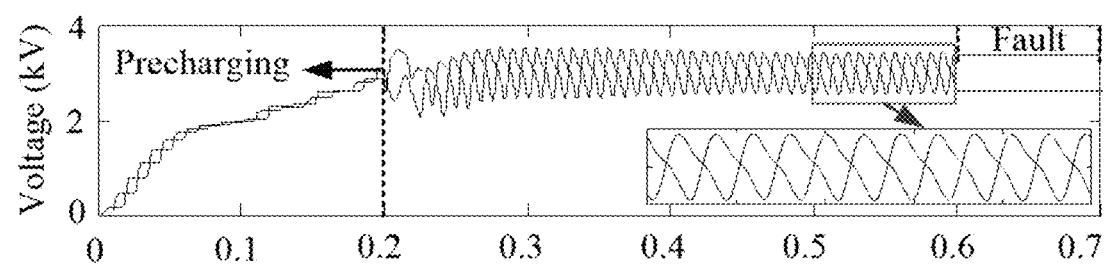
FIG. 17 shows an exemplary average capacitor voltage of MMC1 of the HB-MMC-HVDC based on the reduced-order ECM.

The HB-MMC-HVDC system is modeled and simulated by the DSM and the reduced-order ECM. The phase-a arm currents and capacitor voltages of MMC1 of the HB-MMC-HVDC system are compared and shown in FIGS. 15 and 17. Based on the simulation results, the arm currents and capacitor voltages coincide and the reduced-order ECM is applicable to various operating conditions.

Figure 18A:
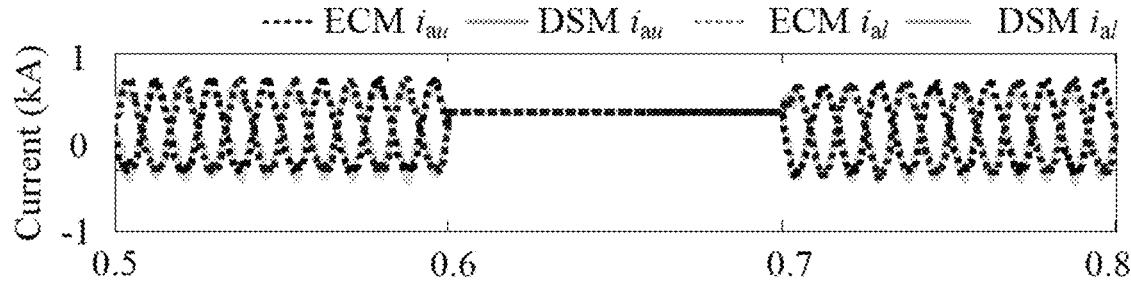
FIG. 18A-18B show exemplary simulation results of MMC1 of the FB-MMC-HVDC based on the DSM and the reduced-order ECM: (A) arm currents, and (B) capacitor voltages.
Figure 18B:
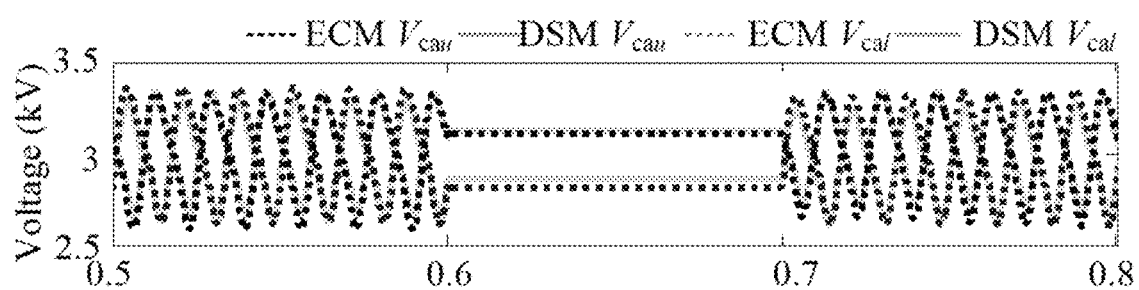
Figure 19:
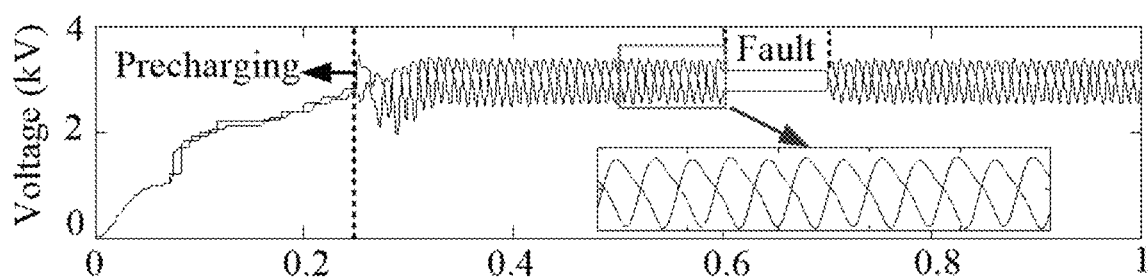
FIG. 19 shows an exemplary average capacitor voltage of MMC1 of the FB-MMC-HVDC based on the reduced-order ECM.

For the FB-MMC-HVDC, the arm currents and capacitor voltages under various operating conditions are shown in FIGS. 18 and 19, which demonstrate the effectiveness of the reduced-order ECM.

II. Power Losses Estimation Based on the ECM

The power losses of semiconductor device consist of the loss of conduction loss ($P_{conT}$, $P_{conD}$) of the IGBT/MOSFET and diode, switching loss ($E_{on}$, $E_{off}$), and the reverse recovery loss ($E_{rec}$) of the diode. According to [15], the power losses of IGBTs can be estimated from parameters in the data sheet, which are given by:

$$\begin{cases} P_{conT} = V_{ce}(i_c) \cdot i_c = (c_0 + c_1 \cdot i_c + c_2 \cdot i_c^2) \cdot i_c, \\ P_{conD} = V_f(i_f) \cdot i_f = (d_0 + d_1 \cdot i_f + d_2 \cdot i_f^2) \cdot i_f, \end{cases} \quad (5)$$

$$\begin{cases} E_{on} = (a_{on0} + a_{on1} \cdot i_c + a_{on2} \cdot i_c^2)\dfrac{V_C}{V_{CEN}}, \\ E_{off} = (a_{off0} + a_{off1} \cdot i_c + a_{off2} \cdot i_c^2)\dfrac{V_C}{V_{CEN}}, \\ E_{rec} = (a_{rec0} + a_{rec1} \cdot i_f + a_{rec2} \cdot i_f^2)\dfrac{V_C}{V_{CEN}}, \end{cases} \quad (6)$$

where $i_c$ and if are obtained from arm current of MMC or phase current of CHB; $V_C$ is the nominal capacitor voltage; $V_{CEN}$ is the rated $V_{ce}$ under test condition; the coefficients $c_0 \sim c_2$, $d_0 \sim d_2$, $a_{on0} \sim a_{on2}$, $a_{off0} \sim a_{off2}$, and $a_{rec0} \sim a_{rec2}$ are extracted from datasheet using curve fitting method. The IGBT and diode currents are determined by the arm current and the switching states of each SM.

III. Comparison with Existing ECMs of MMC

1) The MMC-HVDC Systems Based on Various SM Circuits:

To evaluate the efficiency of the ECM, the simulation speed for various MMC-HVDC systems based on the DSM, the detailed ECM, and the reduced-order ECM is listed in Table III. The system operating time is 1 s and the simulation time step is 10 µs. The simulations are conducted on the operating system of Microsoft Windows 10 with a 2.60 GHz Intel Core i7-6700HQ CPU and 8 GB of RAM.

As indicated in Table III, the ECM can significantly improve the computational efficiency as compared with the conventional DSM while keeping high accuracy.

2) The High-Level MMC-HVDC Systems:

Table IV shows the simulation speed for the MMC-HVDC systems with various voltage levels. As the increasing of the number of SMs, although the simulation speed of the ECM becomes slow, it still much faster than that of the conventional DSM.

As compared with the reduced-order ECM, the computational time of the detailed ECM is more sensitive to the number of voltage levels and its increasing rate is larger than that of the reduced-order ECM.

TABLE III

Comparison of Simulation Speed
for Various MMC-HVDC Systems
Based on the DSM and the Proposed ECM
Simulation settings
Simulation time step = 10 µs; System operating time = 1 s.

| MMC configuration | DSM (s) | ECM (s) Detailed | ECM (s) Reduced-order |
|---|---|---|---|
| HB | 1656.21 | 30.67 | 11.52 |
| FB | 8512.72 | 31.34 | 11.73 |
| CD | 21877.39 | 30.31 | 12.38 |
| 3LCC | 29097.14 | 30.84 | 12.21 |
| Hybrid (HB and FB) | 3179.83 | 30.56 | 11.94 |

TABLE IV

Comparison of Simulation Speed of the MMC-HVDC
Systems Based with Various Voltage Levels
Simulation settings
Simulation time step = 10 µs; System operating time = 1 s.

| MMC Levels | ECM (s) Detailed | ECM (s) Reduced-order | DC Voltage (kV) |
|---|---|---|---|
| 21 | 31.34 | 11.73 | 60 |
| 41 | 37.11 | 12.03 | 120 |
| 61 | 43.89 | 12.45 | 180 |
| 81 | 47.80 | 12.71 | 240 |
| 101 | 54.62 | 13.12 | 300 |
| 201 | 96.56 | 16.29 | 600 |

In brief, a generalized equivalent circuit model (ECM) is disclosed for modeling and simulating the MMCs based on various SM circuits and arm configurations under different operating conditions. Based on the analysis of the behaviors of various MMCs, a generalized arm equivalent circuit is to model and simulate various MMCs under startup/precharging, normal, and fault conditions. The detailed ECM considers all internal states and can be used to investigate internal dynamic control strategies, e.g., capacitor voltage balancing strategies. To further improve simulation efficiency, the reduced-order ECM is derived by neglecting the dynamics of individual capacitor voltage and considering the average capacitor voltage. The modeling technique is applied to an MMC-HVDC system and compared with the conventional DSM to verify efficiency and accuracy. Based on the simulation results, the ECM can efficiently and accurately model and simulate the MMC-HVDC systems based on various SM circuits and arm configuration under different operating conditions. The ECM can significantly improve simulation efficiency and be applied for precharging, normal, and fault operation analysis of the MMC-HVDC systems while considering the behaviors of various SMs. The accelerated model can also be used to investigate internal dynamics based on various control strategies, e.g., capacitor voltage balancing, when full states are considered. To further improve efficiency, the model can be implemented by reduced-order algorithms. The effectiveness of the ECM is verified by an MMC-HVDC system built in PSCAD/EMTDC software environment.

It is noteworthy that any hardware platform suitable for performing the processing described herein is suitable for use with the embodiments provided herein. Computer-readable storage media refer to any medium or media that participate in providing instructions to a central processing unit, a processor, a microcontroller, or the like. Such media may take forms including, but not limited to, non-volatile and volatile media such as optical or magnetic disks and dynamic memory, respectively. Common forms of computer-readable storage media include a floppy disk, a flexible disk, a hard disk, magnetic tape, any other magnetic storage medium, a Compact Disk Read Only Memory disk, DVD, Blu-ray disc, any other optical storage medium, RAM, Programmable Read-Only Memory, Erasable Programmable Read-Only Memory, Electronically Erasable Programmable Read-Only Memory, flash memory, and/or any other memory chip, module, or cartridge.

In some embodiments, the computer system may be implemented as a cloud-based computing environment, such as a virtual machine operating within a computing cloud. In other embodiments, the computer system may itself include a cloud-based computing environment, where the functionalities of the computer system are executed in a distributed fashion. Thus, the computer system, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud may be formed, for example, by a network of web servers that comprise a plurality of computing devices, such as the computer system, with each server (or at least a plurality thereof) providing processor and/or storage resources. These servers may manage workloads provided by multiple users (e.g., cloud resource customers or other users). Typically, each user places workload demands upon the cloud that vary in real-time, sometimes dramatically. The nature and extent of these variations typically depends on the type of business associated with the user.

Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense.

What is claimed is:

1. A method to simulate a circuit, comprising:
receiving at least one circuit requirement and at least one Modular Multilevel Converter (MMC) parameter;
determining an operating mode and switching states of an arm circuit of an MMC;
determining each capacitor current of the MMC based on the switching states and an arm current of the MMC;
determining a capacitor voltage and arm voltage;
estimating power losses of insulated gate bipolar transistors (IGBTs) of the MMC from arm current or phase current parameter by:

$$\begin{cases} P_{conT} = V_{ce}(i_c) \cdot i_c = (c_0 + c_1 \cdot i_c + c_2 \cdot i_c^2) \cdot i_c, \\ P_{conD} = V_f(i_f) \cdot i_f = (d_0 + d_1 \cdot i_f + d_2 \cdot i_f^2) \cdot i_f, \end{cases}$$

$$\begin{cases} E_{on} = (a_{on0} + a_{on1} \cdot i_c + a_{on2} \cdot i_c^2)\frac{V_C}{V_{CEN}}, \\ E_{off} = (a_{off0} + a_{off1} \cdot i_c + a_{off2} \cdot i_c^2)\frac{V_C}{V_{CEN}}, \\ E_{rec} = (a_{rec0} + a_{rec1} \cdot i_f + a_{rec2} \cdot i_f^2)\frac{V_C}{V_{CEN}}, \end{cases}$$

where $i_c$ and $i_f$ are obtained from the arm current of the MMC or phase current of a cascaded H-Bridge (CHB); $V_f$ is the forward voltage of the IGBT; $I_f$ is the forward current of the IGBT; Vc is the nominal capacitor voltage, $VC_{EN}$ is the rated collector-emitter voltage (Vce) of the IGBT under test condition, coefficients $c_0$~$c_2$, $d_0$~$d_2$, $a_{on0}$~$a_{on2}$, $a_{off0}$~$a_{off2}$, and $a_{rec0}$~$a_{rec2}$ are extracted from datasheet using a curve fitting method $P_{conT}$ the conduction loss of the IGBT and $P_{conD}$ the conduction loss of a diode; $E_{on}$, $E_{off}$ are switching losses; and $E_{rec}$ is a reverse recovery loss of the diode; wherein diode currents are determined by the arm current and switching states of submodules (SMs) of the MMC; and
generating an equivalent circuit model (ECM) to simulate an MMC-based high-voltage direct current (HVDC) system and DC grids in a hybrid AC and DC power system.

2. The method of claim 1, wherein the circuit requirement includes one or more of: rated power and rated voltage.

3. The method of claim 1, wherein the MMC parameters include one or more of: capacitance, number of submodules per arm ($N_{SM}$), simulation step time, and submodule configuration.

4. The method of claim 3, wherein the submodule (SM) configuration comprises unipolar SMs and bipolar submodules.

5. The method of claim 4, wherein the unipolar submodules include half-bridge (HB) SM, unipolar-voltage full-bridge (UFB) SM, and three level cross connected (3LCC) SM.

6. The method of claim 4, wherein the bipolar submodules include full bridge (FB) SM, clamp double (CD) SM, and five level cross connected (5LCC) SM.

7. The method of claim 1, comprising simulating submodule circuits and arm configurations under different operating conditions.

8. The method of claim 1, wherein before determining each capacitor voltage, determining a capacitor current from an arm current and submodule switching states.

9. The method of claim 1, comprising applying the ECM for precharging, normal, and fault operation analysis of the HVDC system while considering the behaviors of a plurality of submodules.

10. The method of claim 1, comprising investigating one or more internal dynamics based on a control strategy.

11. The method of claim 10, wherein the control strategy comprises capacitor voltage balancing.

12. The method of claim 1, comprising determining the capacitor voltage by a differential equation and a numerical method.

13. The method of claim 1, comprising determining an arm voltage from voltages of each capacitor.

14. The method of claim 1, comprising determining operating states of the submodules, wherein the operating states include inserted, bypassed, and blocked.

15. The method of claim 1, comprising a fault-blocking submodule with a parallel-connected or series-connected submodule.

16. The method of claim 1, wherein operating conditions of MMCs include a precharging or startup process, a normal operating condition, and a fault condition.

17. The method of claim 1, wherein under a DC fault condition, the MMC based on half-bridge submodule (HB-SM) cannot block a fault current feeding from an AC grid.

18. The method of claim 1, wherein under a DC fault condition, the capacitor in a fault-blocking submodule supports a line-line voltage and block a fault current.

19. The method of claim 1, wherein under a DC fault condition, the MMC is based on bipolar SMs working as a static synchronous compensator.

* * * * *